SWITCHING MEANS FOR HIGH FREQUENCY SIGNALS

Filed Nov. 21, 1960

INVENTORS
LEON RIEBMAN &
WILLIAM F. EPPERLY, Jr.
BY Busser, Smith & Harding
ATTORNEYS United States Patent Office 3,230,386

Patented Jan. 18, 1966

3,230,386

SWITCHING MEANS FOR HIGH FREQUENCY SIGNALS

Leon Riebman, Huntingdon Valley, and William F. Epperly, Jr., Chalfont, Pa., assignors to American Electronic Laboratories, Incorporated, Philadelphia, Pa., a corporation of Pennsylvania Filed Nov. 21, 1960, Ser. No. 70,553
1 Claim. (Cl. 307—88.5)

This invention relates to high power solid state switching means.

Solid state diode switching involves the establishment and a collapse of the barrier charge layer between the semi-conductor bulk and the metal contact. This charge layer is established and collapsed through the application and removal of a bias voltage to the diode terminals. It may be shown that, when radio frequency power is being transmitted through a single diode switch, bias power is required in an amount equal to twice the amount of radio frequency power. Not only does this mean that two-thirds of the power-capability of the switch is required for handling necessary bias power, but in high frequency modulation, of either continuous wave or pulse type, systems capable of delivering high modulating power to the switch must be used, and these are very expensive. Assuming, for example, a diode capable of handling a pulse of power of 150 watts, 100 watts must be the modulation pulse power, and only 50 watts will be radio frequency signal power. This power situation results from the fact that the modulating bias for the switch-on condition must be sufficient to prevent the diode from being cut off by the radio frequency swings which oppose the applied conduction-producing bias, in order that the entire signal may pass through the diode.

It is the object of the present invention to provide a switching system enabling a high power solid state diode to switch at substantially its full power rating utilizing a minimum of bias power to achieve high level switching. This is achieved by utilizing two diodes, one passing the positive swings of the radio frequency signal, and the other its negative swings. For a switch-on condition, therefore, a bias which prevents conduction of the diodes during a switch-off condition is merely reduced to zero for a switch-on condition, with requirements for providing only very low power.

The attainment of the foregoing object, as well as other objects relating to advantageous details, will become apparent from the following description, read in conjunction with the accompanying drawing, in which.

Figure 1:
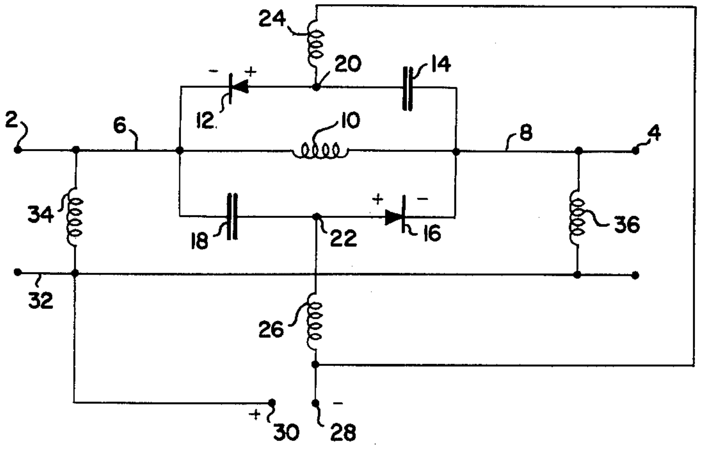
FIGURE 1 is a wiring diagram illustrating a switching system provided in accordance with the invention.

Referring first to FIGURE 1, 2 represents a radio frequency input terminal and 4 represents the output terminal for the modulated radio frequency, reference ground being represented at 32. Input and output connections provided by a coaxial cable arrangement as discussed hereafter are indicated at 6 and 8. Between these connections are three parallel branches. One of them comprises a tuning inductance 10. A second comprises the solid state diode 12 in series with a capacity 14. The third comprises a diode 16, similar to 12, in series with a capacity 18. The diodes are polarized as indicated, and at 20 between the anode of diode 12 and capacity 14 there is connected a choke 24 running to a bias and modulating terminal 28. A similar connection is made at

22 between the anode of diode 16 and capacity 18 through choke 26. The other terminal 30 of the bias and modulating connection is connected to 32. Between connection 32 and the respective connections 6 and 8 there are provided the chokes 34 and 36.

The elements of the arrangement just described have the following characteristics:

The chokes 24, 26, 34 and 36 block loss of radio frequency power from the biasing and modulating devices. The capacitances at 14 and 18 are small and pass the radio frequency signal power but block the modulation and bias. The inductance at 10 is chosen to provide, in conjunction with the effective total capacitance between connections 6 and 8, a parallel resonance circuit at the radio frequency involved. The presence of inductance 10 creates improvement in diminishing bias insertion loss, but its primary result is to increase reverse attenuation in switch-off condition due to the introduction of parallel resonance. All of the inductances involve low impedance to the modulating frequency and static bias. A sufficient static bias is provided between terminals 28 and 30, with polarity as indicated, to cut off both diodes 12 and 16. Alternating modulation is also applied to the terminals 28 and 30, in the form of a continuous modulating wave or pulse to remove the static bias in its swings opposing the static bias. In such swings the bias voltage is removed completely and then conductivity occurs as follows:

During a negative half cycle of the radio frequency signal swing at terminal 2 the diode 12 will be self-biased into conduction so that the radio frequency power will be transmitted. During the opposite, positive, half cycle, the diode 16 is similarly conductive. Thus, the diodes are alternatively conductive (and cut off) during successive half cycles of the radio-frequency signal. The static bias voltage must, of course, be sufficient in magnitude so as to exceed the swings of radio frequency signals to cut them off. The modulation swing, toward a conductive condition, need only be sufficient in magnitude to equal the static bias to reduce the net bias to zero. Since both bias and modulating voltages are, in effect, applied only during non-conducting conditions, when their currents are substantially cut off, very low power is required. Hence, inexpensive modulating and bias sources may be used, and radio frequency may be handled to the extent of the power ratings of the diodes. Under typical conditions only around 5 to 10 milliwatts of bias and modulating power per diode is required.

The foregoing is in contrast with switching involving passage of the entire radio frequency signal through a single diode; then the modulation must be sufficient, in switch-on condition to pass the radio frequency swing that opposes the switch-on modulating pulse or swing. Modulation power must therefore be supplied during switch-on condition.

Figure 2:
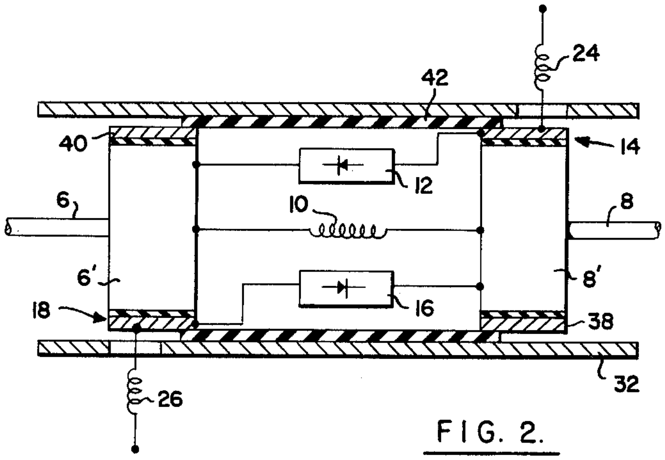
FIGURE 2 is a schematic structural diagram illustrating a preferred physical arrangement of the parts of the switching system.

An optimum physical arrangement is illustrated in FIGURE 2, in which the major switching elements are included in a cavity in a coaxial cable having the central conductors 6 and 8 and the sheath 32 providing the connection illustrated by the same numeral in FIGURE 1. In the physical arrangement the ends of the conductors 6 and 8 are enlarged as shown as 6' and 8', and are surrounded by conductive sleeves 38 and 40 insulated therefrom by a thin dielectric annulus, the sleeves being also insulated as indicated at 42 from the sheath 32 but preferably by a relatively thick air gap with insulation limited to that required for mechanical separation, so that the capacitance to the sheath is low. As will be evident, these arrangements provide the small capacitances 14 and 18, readily passing the radio frequency power but blocking the bias and modulation signals, with grounding effect minimized. The connections from chokes 24 and 26 are made to the sleeves 38 and 40 through openings in the sheath. The chokes 34 and 36 may be provided at any convenient location exteriorly of the enlargements 6′ and 8′.

Figure 3:
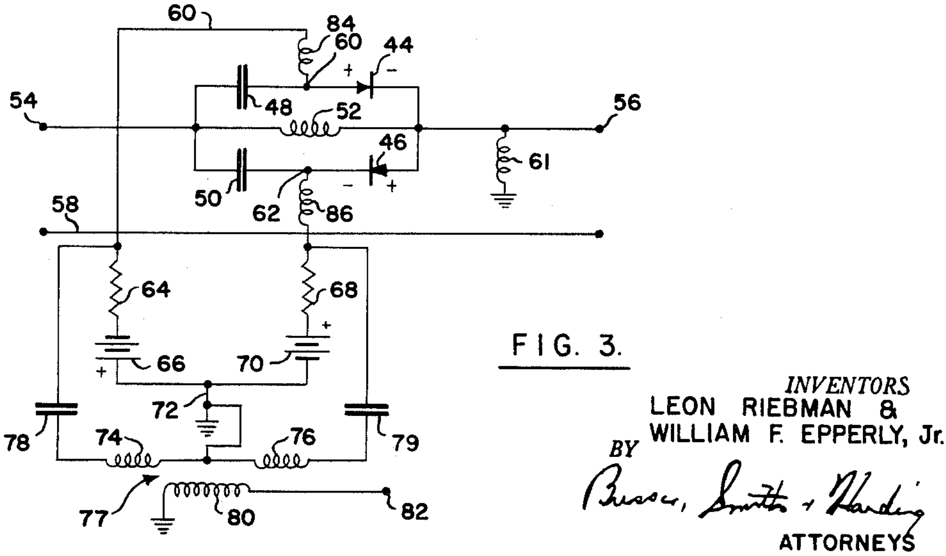
FIGURE 3 is a diagram illustrating an alternative form of the invention.

FIGURE 3 shows a modified arrangement for the switch using a double ended or push-pull arrangement fed from a single-ended input through a pulse transformer. In FIGURE 3 the input and output connections 54 and 56 have located between them the three parallel arrangements comprising, respectively, the tuning inductance 52 (similar in its function to 10), the series arrangement of diode 44 and capacity 48, and the series arrangement of diode 46 and capacity 50. It will be noted that this arrangement is similar to that of FIGURE 1 with the exception that both diodes, which are oppositely polarized, are on the output side of the arrangement (though this may be reversed, with both on the input side). The elements just described may be located in a cavity in a coaxial cable as indicated in FIGURE 2, the coaxial cable having the sheath 58. A ground return may be provided as indicated at 61 from either of the input or output connections.

The connections 60 and 62 run to the upper ends of resistors 64 and 68 which are connected to ground through the static bias sources 66 and 70, illustrated as batteries, the ground connection being indicated at 72. Pulse modulation in this arrangement is provided from a transformer 77 having the secondary winding sections 74 and 76 joined to the connections 60 and 62 through the capacitors 78 and 79. Suitable chokes 84 and 86 isolate the radio frequency signals from the bias and modulating sources. The primary 80 of the pulse transformer 77 receives its pulses from terminal 82.

The operation will be clear from FIGURE 3. The outer terminals of the secondary of the pulse transformer provide signals of opposite polarity to the two diodes, and static biases of opposite polarity are also provided. This condition results from the grounding at 72 of the midpoint of the transformer secondary. When the outputs from the pulse transformer oppose and thereby reduce to zero the static biases, the diodes will conduct. Otherwise, they are cut off.

It will be noted that since the diodes are oppositely polarized with respect to radio frequency input, during the switch-on condition respective positive and negative half cycles of the radio frequency signal will be transmitted by the corresponding diodes. The full radio frequency wave will, accordingly, be transmitted as in the arrangement of FIGURE 1.

A wide variety of conventional power diodes may be used, chosen to handle the radio frequency power involved and to operate effectively at the frequencies involved.

It will be evident that various changes in details may be made without departing from the invention as defined in the following claims.

What is claimed is:

Switching means for high frequency signals comprising an input terminal for such signals, an output terminal for delivery of switched signals, a diode in each of a pair of independent parallel connections between said input and output terminals, said diodes being oppositely polarized with respect to said terminals, means for biasing said diodes to non-conducting condition to block passage of signals from said input terminals to said output terminals, means for substantially removing the biases of said diodes to provide passage of positive swings of said signals through one unbiased diode and negative swings of said signals through the other unbiased diode, and inductance means for tuning the effective capacitances which exist when said diodes are non-conducting to provide a parallel resonant circuit, resonant at the high frequency signal frequency, between said input and output terminals.

References Cited by the Examiner

UNITED STATES PATENTS

| | | | |
|---|---|---|---|
| 2,811,693 | 10/1957 | Holzwarth et al. | 332—47 X |
| 2,866,103 | 12/1958 | Blake et al. | 307—88.5 |
| 2,896,075 | 7/1959 | Addleman | 329—162 |
| 2,965,771 | 12/1960 | Finkel | 307—88.5 |
| 3,011,129 | 11/1961 | Magleby et al. | 307—88.5 |

JOHN W. HUCKERT, *Primary Examiner.*

GEORGE N. WESTBY, ARTHUR GAUSS, *Examiners.*